United States Patent

Weisshaar

[15] 3,644,799

[45] Feb. 22, 1972

[54] SEMICONDUCTOR ELEMENT HAVING AT LEAST ONE CONTROL ELECTRODE

[72] Inventor: Erich Weisshaar, Aargau, Switzerland

[73] Assignee: Transistor AG, Zurich, Switzerland

[22] Filed: Mar. 19, 1970

[21] Appl. No.: 21,067

[30] Foreign Application Priority Data

Mar. 21, 1969 Switzerland ..........................4315/69

[52] U.S. Cl. ................317/235 R, 317/234 R, 317/235 AB, 317/235 AJ, 317/235 AK, 317/234 N, 148/186

[51] Int. Cl. ........................................................H01l 11/00

[58] Field of Search....................317/235, 21, 41.1, 47, 47.1

[56] References Cited

UNITED STATES PATENTS

| | | | |
|---|---|---|---|
| 2,837,704 | 6/1958 | Emeis | 317/235 |
| 2,842,724 | 7/1958 | Thedieck | 317/235 |
| 2,929,006 | 3/1960 | Herlet | 317/235 |
| 3,275,482 | 9/1966 | Meir | 148/177 |
| 2,952,804 | 6/1960 | Franke | 317/235 |

*Primary Examiner*—John W. Huckert
*Assistant Examiner*—B. Estrin
*Attorney*—Anderson, Luedeka, Fitch, Even and Tabin

[57] ABSTRACT

A semiconductor element, particularly a disconnectable thyristor comprises at least one control electrode and a semiconductor body having a surface region of a determined conductivity-type. One or more zones of another conductivity-type are diffused into said surface region and are surrounded by regions of said determined conductivity-type. Said zones of another conductivity-type are each contained in a pit and the wall regions of the pit exhibit the conductivity-type of the respective zones. Said pits preferably are comb-shaped and arranged with interengaging comb teeth.

6 Claims, 4 Drawing Figures

PATENTED FEB 22 1972 3,644,799

SEMICONDUCTOR ELEMENT HAVING AT LEAST ONE CONTROL ELECTRODE

Figures 1, 2, 3, 4:
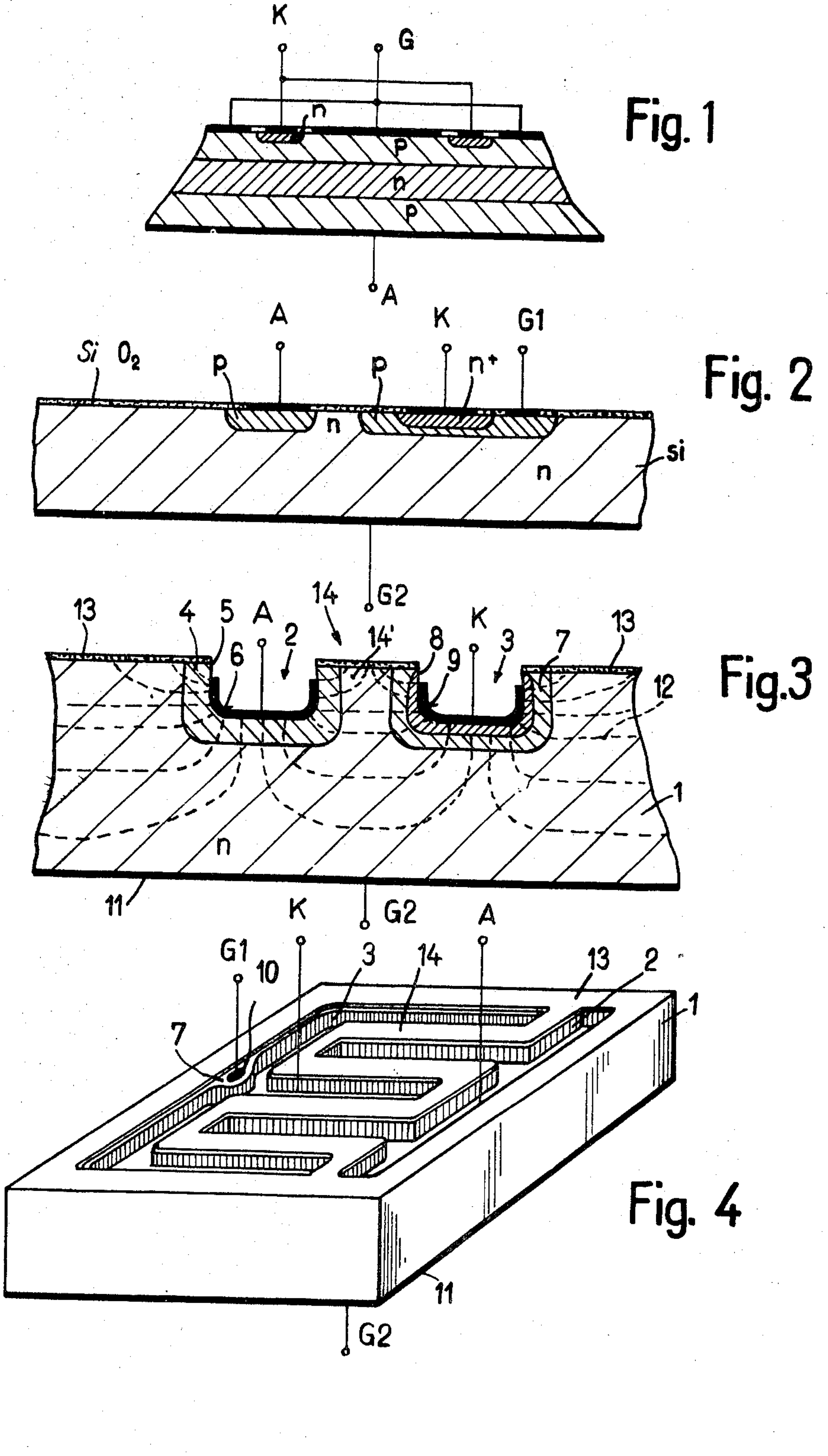

The invention relates to a semiconductor element having at least one control electrode, in which there is diffused into the surface area of a semiconductor body of a certain conductivity type at least one zone of another conductivity type, and this zone is surrounded by areas of the first-named conductivity type; particularly the invention concerns a disconnectable thyristor.

As it is known, a thyristor consists of a four-layer PNPN semiconductor body to the outer P-conductive layer of which the anode, to the outer N-conductive layer of which the cathode and to one of the two inner layers, either the N-conductive or the P-conductive layer, the control electrode or the gate is connected. A disconnectable thyristor practically is only then operable when the internal resistance of the control electrode is very small. Essentially, two types of thyristors are known. In one type, the semiconductor body, for example, comprises three superposed layers of the conductivity P-N-P, and one of the P-conductive outer layers carries as cathode, K, a narrow annular N-conductive zone which is surrounded by immediately adjacent gate electrodes G. The anode A is connected to the other P-conductive outer layer (FIG. 1). Such thyristors produced by the application of the known "alloy-diffused" or "fully-diffused" technology generally can be used for a rated current of 1 to 2 amps. Theoretically with such a formation also thyristors for much greater currents would be possible, in practice, however, limits are set by the too high cost of the expensive gate-cathode structure and the difficulties encountered for applying the corresponding contacts. For the production of disconnectable thyristors having a small output, i.e., of thyristors with rated currents of about 100 to 500 ma. the known "planar"-technology (Swiss Pat. No. 442,534) may be used advantageously. This technology leads to the other type of thyristors which consists, for example of an N-conductive semiconductor disc, e.g., of silicon, the PNPN structure being realized at one of the disc faces by indiffused zones of corresponding conductivity.

The limitation to small outputs in this lateral structure is substantiated by the fact that the proper thyristor (FIG. 2) is situated in a thin layer beneath the surface. This means, that in conductive condition the major portion of the charge carriers is lost in the surface owing to the basically great surface recombination, which results in a great voltage loss and accordingly in great leakage power. The advantage of this formation is, besides the possibility of the oxide passivation ($SiO_2$) of the active surfaces, also the accessibility of the intermediate N-layer by means of a second control electrode or gate G2. This permits a particularly small internal resistance and thus a correspondingly great breaking gain. This latter term indicates the ratio between the gate current $I_G$ required for switching off and the flowing anode-cathode current $I_A$.

The object of the invention is the provision of a semiconductor element having at least one control electrode, for rated currents of about 10 to 100 amps., particularly a disconnectable thyristor, which semiconductor element can be produced by the application of the mentioned planar technology and accordingly comprises the advantages offered by the latter, particularly that of the oxide passivation of the active surfaces.

According to the invention, a semiconductor element comprising at least one control electrode and a semiconductor body having a surface region of a determined conductivity type, a zone of another conductivity type being diffused into said surface region and said zone being surrounded by regions of said first-named conductivity type, is provided with a depression for said zone in said semiconductor body, and the wall regions of said depression exhibit the conductivity type of said zone.

The zone depression advantageously can be in the shape of a pit, in a semiconductor element having two zones their pit-shaped depressions being formed in interdigitated fashion, or like combs and being arranged with interengaging comb teeth.

The invention will now be fully explained with reference to the accompanying drawings, in which FIG. 1 shows diagrammatically in section a first known form of embodiment of a thyristor consisting of a semiconductor body having superposed layers of different conductivity, which Figure serves for explaining the state of the art, FIG. 2 shows diagrammatically in partial section a second known form of embodiment of a thyristor produced by the application of the "planar" technology, FIG. 3 is a diagrammatic sectional view of a thyristor constructed according to the invention, and FIG. 4 shows the thyristor of FIG. 3 in perspective view.

The known construction of a thyristor shown in FIG. 1 having a control electrode or a gate has been already explained above in the introductory statement.

As shown diagrammatically in section in FIG. 2, a known thyristor produced according to the "planar" method having two control electrodes, for example consists of an N-conductive silicon disc having diffused into one of its side faces zones of different conductivity, namely P-conducting zones which carry contact layers for connecting the anode A, and P-conducting zones having inserted $N^+$-conducting zones, the $N^+$-conducting zones carrying contact rails for connecting the cathode K, and the P-conducting zones situated below the $N^+$-zones and surrounding these latter at the edges carrying contact layers for connection of a first control electrode or gate G1. The other side of the silicon disc is provided with a contact layer for the connection of a second control electrode or gate G2. The surface regions of the silicon disc which are not metal coated are covered by a protective layer of $SiO_2$. It has been mentioned already that in this known thyristor construction the great surface recombination of the charge carriers is disadvantageous.

FIGS. 3 and 4 show a thyristor constructed according to the invention. The thyristor consists of an N-conductive silicon disc 1. On one side of the silicon disc 1, which carries the zones of different conductivity, there are depressions at the places of these zones, which preferably are formed as pits 2 and 3 having a U-shaped cross section. These pits can be produced easily according to known marking and etching methods. In FIG. 3 there are shown in section an "anode" and a "cathode" pit 2 and 3. The walls of the "anode" pit 2 consist of P-conductive semiconductor material, namely of a P-conductive silicon layer 4, which extends until the upper pit edges 5. This P-conductive layer 4 is coated with a metal layer 6 which extends until near the upper pit edges 5 on both sides of the pit. The metal layer 6 serves for the connection of the anode A. In the "cathode" pit 3 there is arranged an $N^+$-conductive layer 8 on a P-conductive layer 7 which can be formed in the same manner as the P-conductive layer 8 of the "anode" pit 2, the $N^+$-conductive layer 8 preferably covering the entire pit wall. A metallic coating 9 is again applied to this $N^+$-conductive layer, which coating serves for the connection of the cathode K. The first control electrode or gate G1 (FIG. 4) is applied to the P-conductive layer 7 of the cathode pit 3. Therefore, this layer 7 is provided with a contact layer 10 at a suitable place of the semiconductor disc 1, to which is connected the first control electrode G1.

The second control electrode or gate G2 is connected to the bottom side of the semiconductor disc 1 which, for this purpose, also is provided with a contact layer 11 of a suitable metal. The internal resistance of the gate zone is small as compared with the zone of gate G2, so that G2 particularly can be used for switching off the ignited thyristors. In FIG. 3 the current paths 12 are represented in dotted lines. In the web 14 between the two pits 2 and 3, their P-conductive zones 4 and 7 are separated from each other by a layer 14′ of the N-conductive material of the semiconductor plate. The width of this N-conductive intermediate layer 14′ preferably is not greater than the depth of the pit. As is visible, only a small portion thereof opens into the surface of the disc situated between the pits, so that only a correspondingly small portion of charge carriers is lost by surface recombination. The free surface regions of the silicon disc 1 not provided with contact layers are covered, as already mentioned, with a protective layer 13 of $SiO_2$.

The rated current of a thyristor applied in such manner is determined essentially by the length of the "anode" and the "-cathode" pit.

In order to obtain the smallest possible semiconductor elements of high current, it is possible to form the "anode" and "-cathode" pits in comb shape, as shown in FIG. 4, and to arrange them in the semiconductor body 1 with interengaging comb teeth.

The doping of the semiconductor disc, i.e., the production of the zones of different conductivity in the region of the pit walls, is effected according to known methods, preferably according to the diffusion method of the planar technology, which, for example, is described in Swiss Pat. No. 442,534. In order to give an idea of the dimensioning of the semiconductor elements formed according to the invention, data given by way of example shall be indicated for a disconnectable thyristor produced as described.

| | |
|---|---|
| Thickness of the Si disc | 200μ |
| depth of pit | 50μ |
| depth of penetration (p) | 25μ |
| depth of penetration n+ | 10μ |
| width of pit | 100μ |
| width of the n-zone between the pits | 50μ |
| ρ (n) | 5–10 ohm cm. |

Such thyristors can switch rated currents of 10 to 100 amps. Besides thyristors, the present invention is also applicable to other semiconductor elements, such as e.g., transistors, so-called triacs, i.e., semiconductor elements in which two inversely parallel connected controlled rectifiers are combined in a semiconductor body, etc.

The number of pits and the doping of the pit walls naturally depends on the kind of the semiconductor element to be produced.

I claim:

1. A four or more layer semiconductor device comprising a semiconductor body of a first conductivity type, two elongated pit-shaped depressions formed in one major surface of said body and arranged in interdigitated fashion, a region of opposite conductivity type diffused into substantially the entire surface of each depression, a region of first conductivity type diffused into one of said opposite conductivity type regions along substantially the entire surface of one of the depressions, said opposite conductivity type regions being separated from each other by a surface region of said semiconductor body of first conductivity type, a metal contact layer disposed upon the surface of said first conductivity type diffused region and another metal contact layer disposed upon the surface of said opposite conductivity type region diffused into the other of said depressions, said contact layers constituting cathode and anode electrodes, and a further metal contact disposed upon a portion of the opposite conductivity type region diffused into said one depression terminating at said one major surface, said further contact constituting a gate electrode.

2. A semiconductor device according to claim 1 in which said pit-shaped depressions are each formed in comb shape and arranged with the comb teeth in interengagement.

3. A semiconductor device according to claim 1 wherein said surface region of first conductivity type separating said opposite conductivity type regions has a width no greater than the depth of said pit-shaped depressions.

4. A semiconductor device according to claim 3 wherein the width of said surface region is equal to the depth of said depressions.

5. A semiconductor device according to claim 1 wherein the edge of the contact layer disposed upon the surface of said opposite conductivity type region in said other depression is spaced from the upper edges of said other depression.

6. A semiconductor element according to claim 5, in which the free surface of said semiconductor body is coated with a protective layer.

* * * * *